United States Patent [19]
Fujii et al.

[11] Patent Number: 5,438,197
[45] Date of Patent: Aug. 1, 1995

[54] FOCUSED ION BEAM APPARATUS

[75] Inventors: Toshiaki Fujii; Yasuhiko Sugiyama, both of Tokyo, Japan

[73] Assignee: Seiko Instruments Inc., Tokyo, Japan

[21] Appl. No.: 272,545

[22] Filed: Jul. 11, 1994

[30] Foreign Application Priority Data

Jul. 9, 1993 [JP] Japan .................................. 5-170612

[51] Int. Cl.⁶ ............................................ H01J 37/28
[52] U.S. Cl. ...................................... 250/309; 250/397
[58] Field of Search ................... 250/309, 397

[56] References Cited

U.S. PATENT DOCUMENTS

| | | | |
|---|---|---|---|
| 4,236,073 | 11/1980 | Martin | 250/309 |
| 4,851,673 | 7/1989 | Izumi et al. | 250/309 |
| 5,004,927 | 4/1991 | Nakagawa | 250/309 |

FOREIGN PATENT DOCUMENTS 55-86059 6/1980 Japan .................................. 250/309

Primary Examiner—Jack I. Berman
Attorney, Agent, or Firm—Spensley Horn Jubas & Lubitz

[57] ABSTRACT

A focussed ion-beam apparatus, to realize the simultaneous observation of both the brighter area and the darker area on the sample, which are generated because of the difference in the generation efficiency of the secondary charged particle due to the ion-beam irradiation. According to the result in the comparison of the output signal from the secondary charged particle detector with the reference voltage, to optimize the signal above as the input signal for the image display. To realize the simultaneous observation of both the brighter area and the darker area of the sample.

5 Claims, 5 Drawing Sheets

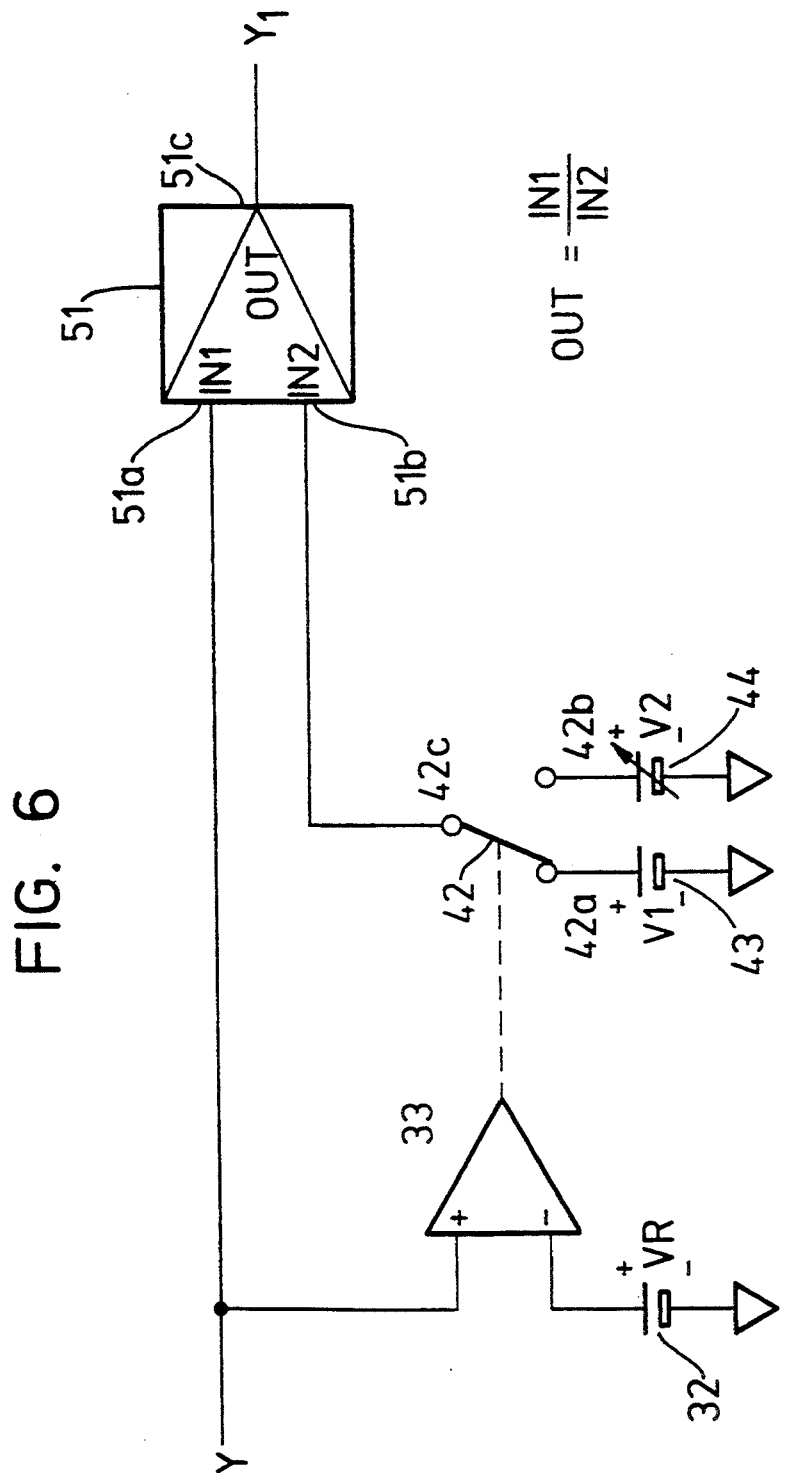

FOCUSED ION BEAM APPARATUS

BACKGROUND OF THE INVENTION

This invention relates to a focussed ion-beam apparatus which processes a predetermined area on a sample surface by means of a focussed ion-beam which is scanned to irradiate the predetermined area on the sample surface and/or which surveys the sample surface by means of the detection of secondary particles generated from the irradiation by the focused ion-beam. The invention specifically relates to an amplifier circuit connected to a secondary particle detector.

Referring to FIG. 1, the signal treatment of an output signal from the secondary charged particle detector will be explained.

As shown in FIG. 1, the secondary charged particle 14 is detected by the detector 11. Although the range of the output signal X from the detector is determined according to the surface condition of a sample 10, that range does not necessarily coincide with that of an input signal to the image display 13. Then, the calculating operation of the formula (1) is carried out by a first amplifying circuit 12a, in order that a detecting signal X can be optically displayed on the image display.

$$Y = A \times X + B \qquad \text{Formula(1)}$$

The variable Y represents the output of the first amplifying circuit 12a. The variable A represents the contrast coefficient, the variable B represents the brightness coefficient, and both can vary. For example, when the dynamic range of the detector's output signal (maximum/minimum signal) is narrower than that of input signal of the image display 13, as shown in FIG. 2a, the optimization of the signal can be realized by way of the calculating operation of formula (1) through changing the value of the variable A to greater than 1 in the formula (1).

However, depending on the surface condition of the sample, there are situations in which the dynamic range of the detector's output signal becomes broader than that of the image display. In this situation, the amount of information in the detector's output signal can be decreased in the calculating operation by changing the value of the variable A to less than 1 in the formula (1).

In general, the manner in which the value of the term A is determined is by detecting changes in the brightness in the image generated by the secondary particles when the charged particle is scanned to irradiate the sample surface. Included in the observation area are both brighter areas (the area which consists of the material of which the secondary (electron) emission coefficient is bigger, for example the surface exposed metal) and darker area (the area which consists of the material of which the secondary (electron) emission coefficient is smaller, for example silicon oxide film). One shortcoming of this design is that once A and B in the formula (1) are adjusted in order that the brighter area can be observed, the darker area can not be observed, and once it is adjusted so that the darker area can be observed, the brighter area can not be well observed because of halation, where the brighter area brightens too much.

Then, as observed in the formula (2), in order to obtain good image, even when the input signal provides a broad dynamic range, a larger calculating gain $A_1$ is given to the smaller signals relative to the reference voltage K, and the smaller calculating gain $A_2$ is given to the bigger signals relative to the reference voltage K.

$$Y_1 = A_1 \times Y \text{ where } Y \leq K \quad Y_1 = A_2 \times Y \text{ where } Y > K$$
$$\text{and where } A_1 > A_2 \qquad \text{Formula(2)}$$

In order to obtain $A_1$ and $A_2$ in the formula (2), in prior art as shown in FIG. 3, the second amplifying circuit 12b (In-phase amplifying circuit) is arranged in series behind the first amplifying circuit 12a, where $R_1 = R_4$, and $R_2 = R_3$.

When the input signal Y is smaller than the threshold voltage VD in forward direction of diode 26 (the reference voltage K), the diode 26 is set to an open condition and the output signal $Y_1$ is given as in the formula (3)

$$Y_1 = (R_1/R_2 + 1)Y \qquad \text{Formula(3)}$$

That is, $R_4/R_3 + 1$ is identical to $A_1$ in the formula (2).

And, when the input signal Y is bigger than VD, the diode is set to a short-circuit condition, and the output signal $Y_1$ is given as in the formula (4).

$$Y_1 = Y + (R_1/R_2)VD \qquad \text{Formula(4)}$$

In this case, 1 is identically equal to $A_2$ in the formula (2).

Thus, the image is displayed, in prior art, in that higher gain is given to the lower signal and that lower gain is given to the higher signal.

The traditional circuitry is mainly used as for the signal processor of the scanning type electron microscope. In the case of the electron microscope, the electron is the preliminary charged particle, and the maximum secondary electron emission coefficient in the brighter area may be only 10 times greater than the secondary electron emission coefficient in the darker area. Therefore, the second term in the formula (4) does not become so big since the operating gain $(R_1/R_2 + 1)$ in the smaller signal inputs is relatively small. As a result, a problem does not occur.

But in the focussed ion-beam apparatus, the maximum secondary charged emission coefficient in the brighter area can be 100 times greater than the maximum secondary charged emission coefficient in the darker area, since the primary charged particle is an ion. Therefore, when a sufficiently large operating gain $(R_1/R_2 + 1)$ is given to the smaller signals, a problem occurs that a good image can not be obtained because the second term $(VDR_1/R_2)$ in the formula (4), which is the error term, becomes so big that it can not be treated as negligible.

SUMMARY OF THE INVENTION

In order to solve the problem above, which is to realize a situation wherein the formula (2), which does not include the error term, may properly be used the configuration of an amplifier circuit which can change the operating gain according to the output signal from the comparator is desired. Such an amplifier may be realized in an amplifier circuit comprising: a differential amplifier which has an inverting input, a non-inverting input and an output; a comparator; a switch which is controlled through the output of the comparator, of which one end is grounded, and which has a low shunt resistance; a first resistance, having an input end for receiving an input signal and an output end which is coupled to the non-inverting input of said differential amplifier; a second resistance, having a first end coupled to the non-inverting input of said differential amplifier and having a second end coupled to the ungrounded side of said switch; a third resistance, having a first end coupled to ground and a second end coupled to the inverting input of said differential amplifier; and a fourth resistance, having a first end coupled to the output of said differential amplifier and a second end coupled to the inverting input of said differential amplifier.

Using the apparatus which is described above, the error term ($VDR_1/R_2$) in the formula (4) becomes zero in the calculation of the second amplifying circuit, and therefore the brighter and the darker areas of the sample can become observed, which was impossible in prior art.

An alternative embodiment of the amplifier of the present invention may comprise a first standard voltage source which produces a first standard voltage, a comparator which compares an input signal based upon a detector signal produced by the detector with the first standard voltage, a second standard voltage source which generates a second standard voltage, a variable voltage source which generates a system specific voltage, a change-over switch which has a first and a second state, the first state providing input from a first input terminal which is coupled to the second standard voltage source and the second state providing input from a second input terminal which is coupled to the variable voltage source and which outputs a signal dependent upon its state and further wherein the switch state is dependent upon the output of the comparator. Further, the amplifier comprises a multiplier which outputs the product of an input signal based upon the detector signal received at a first input terminal of the multiplier and the output of the change-over switch received at a second input terminal of the multiplier.

Still another alternative embodiment of the present invention may use a divider in place of the multiplier in the circuit described above.

BRIEF DESCRIPTION OF THE DRAWING

FIG. 6 shows a circuit drawing of the second amplifier 12b, illustrated in FIG. 1, of a further embodiment of the present invention.

DESCRIPTION OF THE PREFERRED EMBODIMENTS

Figure 1:
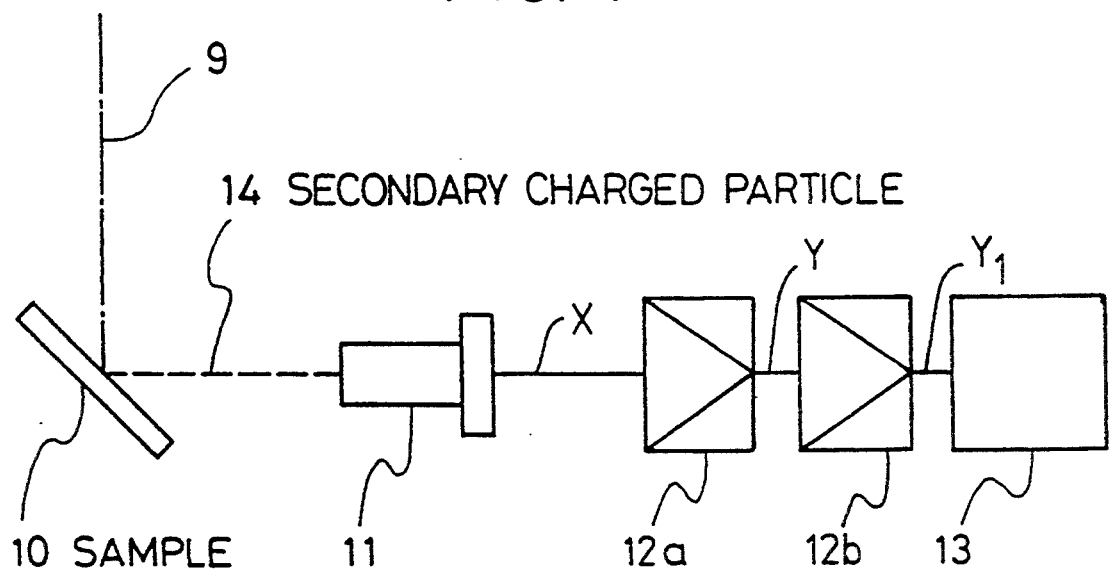
FIG. 1 shows a block diagram of the apparatus.
Figure 2A:
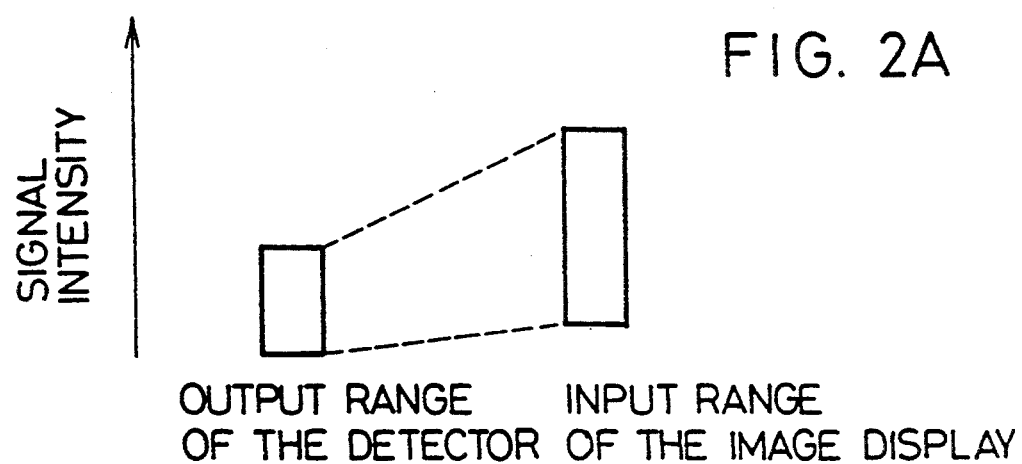
FIGS. 2a and 2b show the signal-intensity Drawings related to the signal treatment on output signal of the secondary charged particle detector.
Figure 2B:
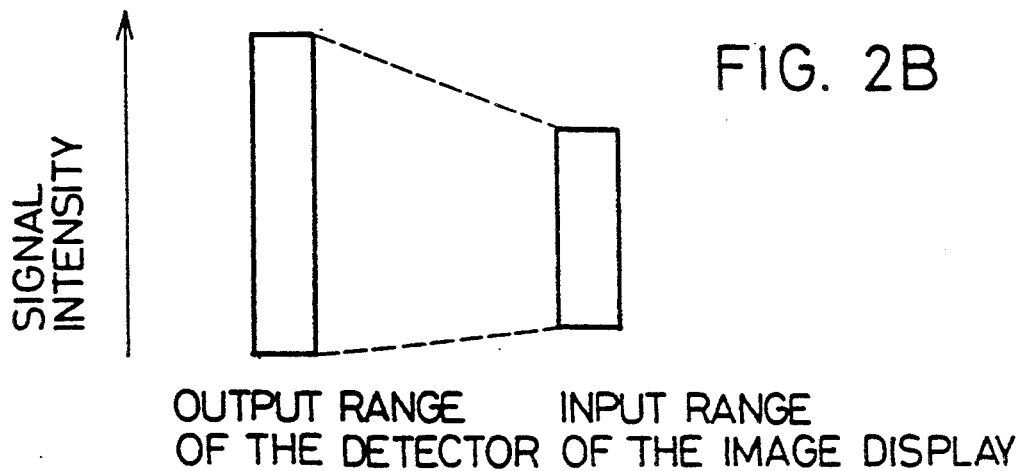
Figure 3:
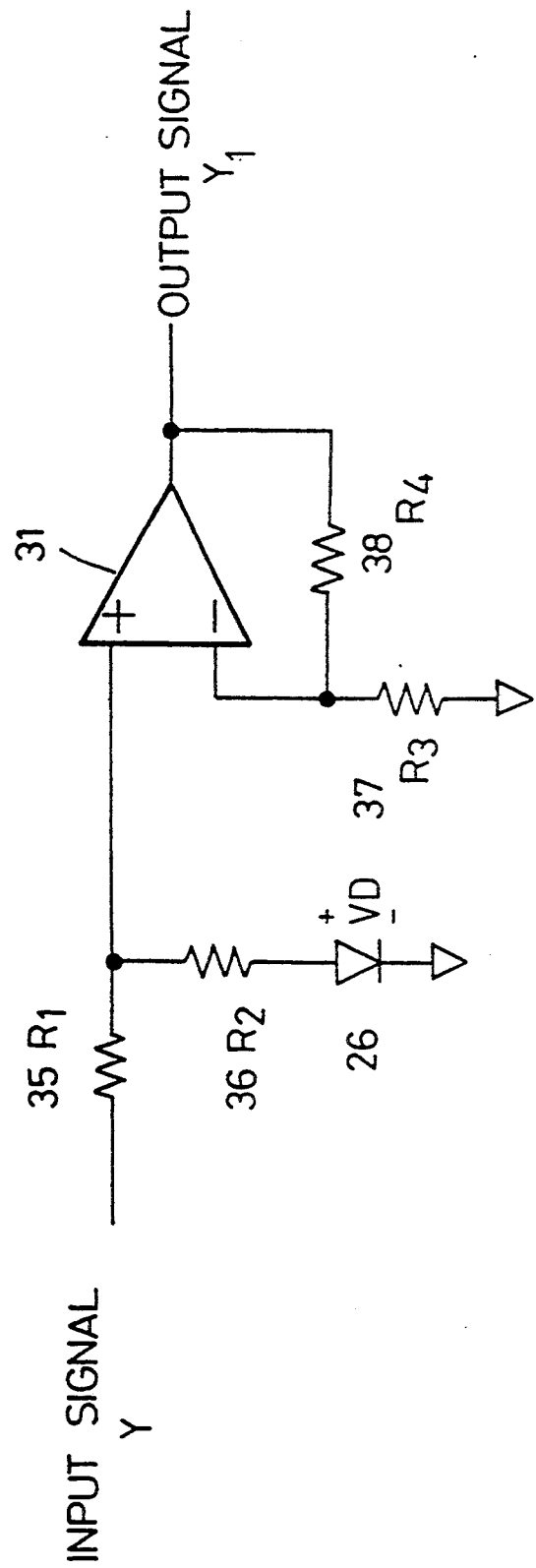
FIG. 3 shows a circuit drawing of the second amplifier 12b, illustrated in FIG. 1, of the prior art.

First, the outline of the focussed ion-beam apparatus (not shown) is explained, which is comprised of, a liquid metal ion source which generates liquid metal ions, the ion optics system which focuses the liquid metal ions, generated from the liquid metal ion source, to create a focused ion beam 9. Referring to FIG. 1, the present invention will be described. The focussed ion beam 9 is deflected and scanned to irradiate a predetermined area on a sample 10 surface. The detector 11 detects the secondary charged particle 14 generated from the sample 10 due to the irradiation by the focussed ion beam 9. First and second amplifying circuit 12a and 12b are arranged in series for the amplification of the signal from the detector 11, and image display 13, which receives an input signal from the amplifying circuit 12b which in turn received an input signal from amplifying circuit 12a, displays the image of the sample 10 based on the signals received therefrom.

Figure 4:
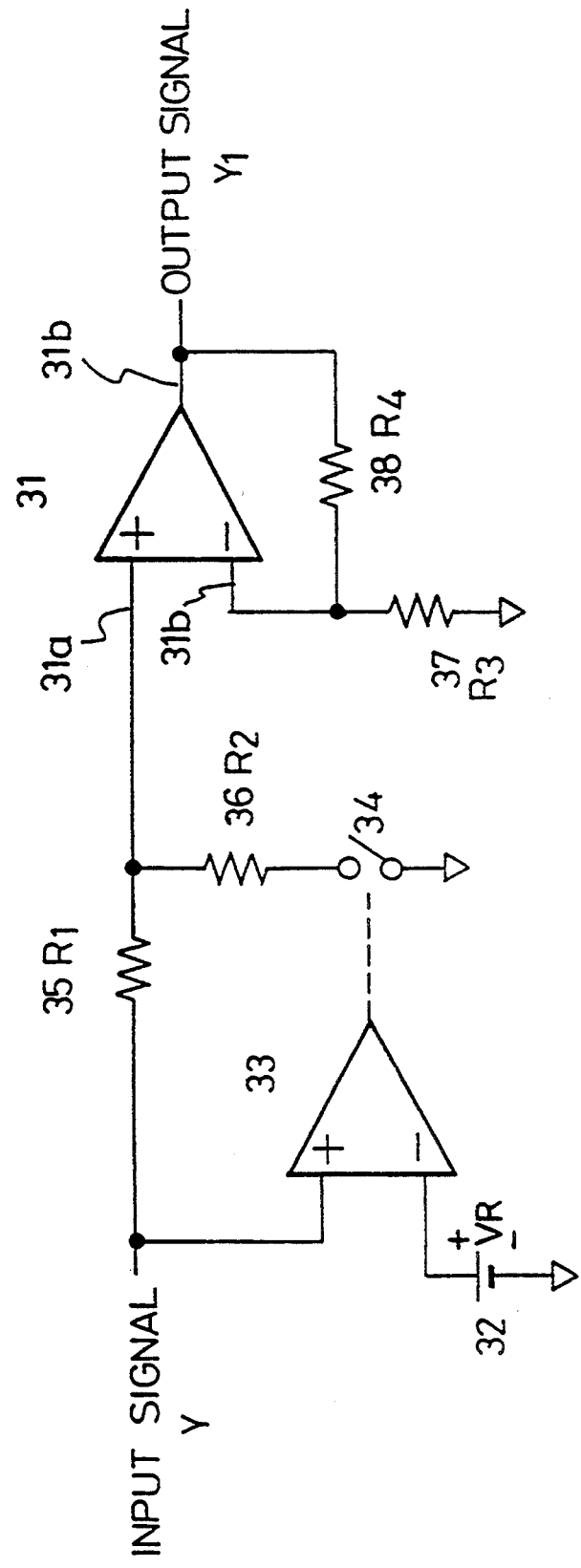
FIG. 4 shows a circuit drawing of the second amplifier 12b, illustrated in FIG. 1, of an embodiment of the present invention.

An embodiment of the second amplifying circuit 12b of the present invention is illustrated in FIG. 4 and is herein after described. As concerns the discussion of the present invention, the first amplifying circuit, as it related to the present invention second amplifying circuit, is the same as described in relation to the prior art second amplifying circuit and as it relates to formula (1).

The differential amplifier 31 receives a signal from the first amplifying circuit 12a through a first resistance $R_1$. The output of the first amplifying circuit 12a is input to a first end of resistance $R_1$. The output of resistance $R_1$ is input to the non-inverting electrode 31a. The output signal Y, representing the amplifying signal, is coupled from the output electrode 31c to the image display 13. The output of the differential amplifier 31 is coupled a first end of fourth resistance $R_4$. A second end of resistance $R_4$ is coupled to the non-inverting input electrode 31b of the differential amplifier 31. The non-inverting input electrode 31b of the differential amplifier 31 is also coupled to a first end of a third resistance $R_3$. Further, a second end of resistance $R_3$ is coupled to ground. A second resistance $R_2$ is coupled, at a first end to the non-inverting electrode 31a. A second end of resistance $R_2$ is coupled in series to a first end of a switch 34, having a shunt resistance smaller than resistance $R_2$. A second end of switch 34 is coupled to ground.

The first resistance $R_1$ and the fourth resistance $R_4$ may have the same resistance value, and the second resistance $R_2$ and the third resistance $R_3$ may have the same resistance value.

The input signal Y is also coupled to the positive electrode (+) of the comparator 33. The negative electrode (−) of the comparator 33 is coupled to a reference voltage source 32, which outputs the reference voltage VR. And the comparator 33 compares the values input into the positive electrode (+) and the negative electrode (−). In the case where the reference voltage VR is greater than the input signal Y, the comparator places the switch 34 in an open position (to stop the current). In this instance, the output $Y_1$, of the second amplifier 12b, as illustrated in FIG. 4, is defined by the formula (5) as follows:

$$Y_1 = (R_1/R_2 + 1)Y \text{ where } VR > Y \qquad \text{Formula(5)}$$

In the case where the reference voltage VR is smaller than the input signal Y, the comparator places the switch 34 in the closed or shunt position (the current runs). In this instance, the output $Y_1$ of the second amplifier, of FIG. 4, is defined by the formula (6) as follows:

$$Y_1 = Y \text{ where } VI < Y \qquad \text{Formula(6)}$$

Figure 5:
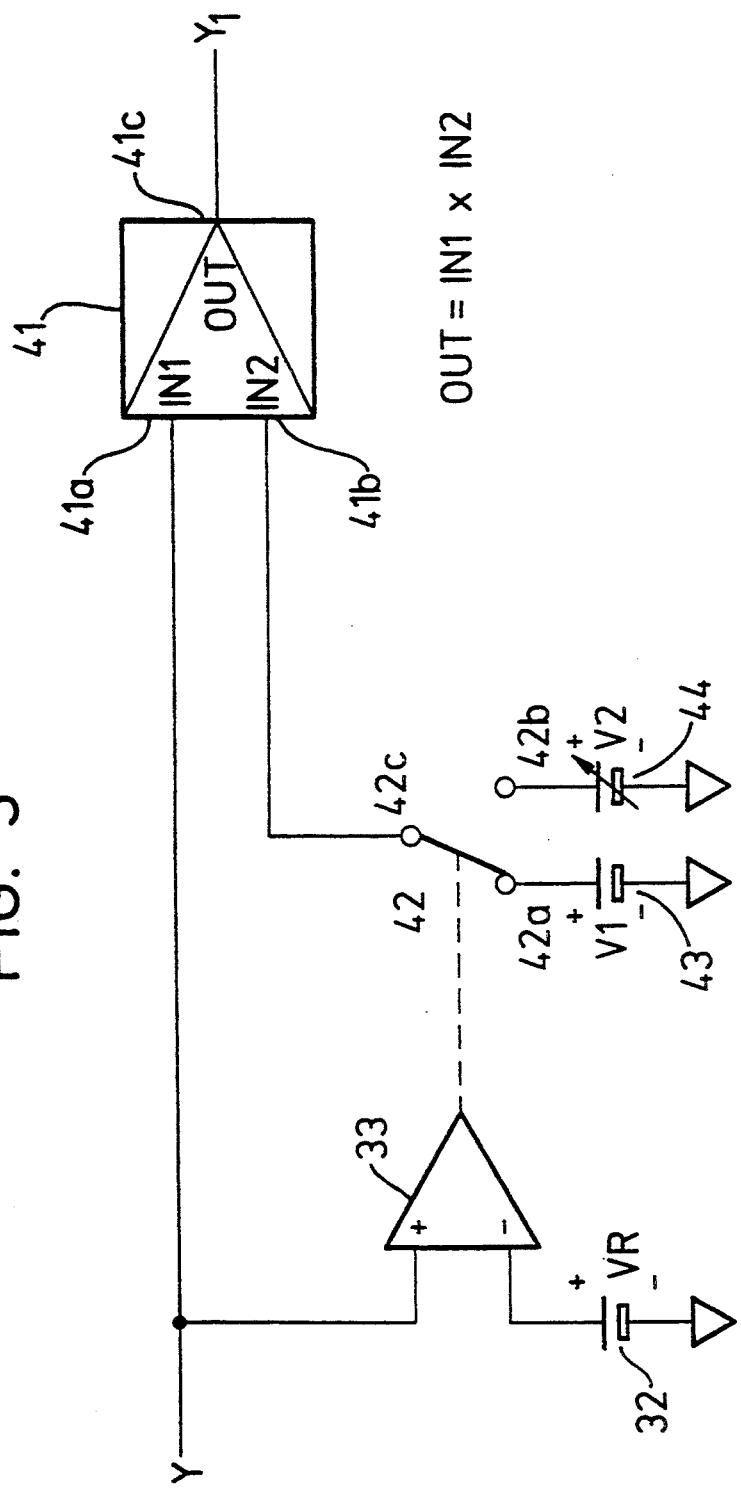
FIG. 5 shows a circuit drawing of the second amplifier 12b, illustrated in FIG. 1, of a further embodiment of the present invention.

A further embodiment of the present invention, as illustrated in FIG. 5, is now described. This embodiment implements a design utilizing a multiplier 41. Further, in this embodiment, a comparator 33 compares the output of the standard voltage source 32, which generates a standard voltage VR, and the signal Y which is the output of the first amplifier 12a. The comparator 33 outputs the comparison result. The signal Y is input to the + terminal of comparator 33 and the standard voltage VR is input to the − terminal of the comparator 33. The output of the comparator 33 is coupled to and controls the state of the change-over switch 42. The change-over switch may have two states. The first state corresponding to the switch being connected to a first input terminal 42a and the second stated corresponding to the switch being connected to a second input terminal 42b. The first input terminal 42a is coupled to a second standard voltage source 43 which produces a voltage of $V_1$. The second input terminal 42b is coupled to a variable voltage source 44 which produces a voltage of $V_2$. Further, the change-over switch has an output terminal 42c for outputting a signal according to the switch state. The operation of the change-over switch 42 is controlled by the output of comparator 33. As such, when the standard voltage VR is greater than the input signal Y, the change-over switch 42 is set to the second state and therefore the output terminal 42c is coupled to the second input terminal 42b. In accordance with the foregoing, when the standard voltage VR is less than the input signal Y, the change-over switch 42 is set to the first state and therefore the output terminal 42c is coupled to the first input terminal 42a.

The multiplier 41 has a first input terminal 41a for inputting the signal Y from the first amplifier 12a and a second input terminal 41b for inputting the signal from the change-over switch output terminal 42c. The multiplier 41 multiplies the signal Y by the signal from the switch output terminal 42c and outputs the product at output terminal 41c.

As stated above, when the standard voltage VR is greater than the input signal Y, the comparator 33 controls the change-over switch 42 to couple the switch output 42c to the variable voltage source 44 at input terminal 42b. Therefore, the output $Y_1$ of the amplifier of FIG. 5 follows the equation (7) as follows.

$$Y_1 = V_2 \times Y \text{ where } VR > Y \qquad \text{Equation(7)}$$

Further, when the standard voltage VR is less than the input signal Y, the comparator 33 controls the change-over switch 42 to couple the switch output 42c to the second standard voltage source 43 at input terminal 42a. Therefore, the output $Y_1$ of the second amplifier of FIG. 5 follows the equation (8) as follows.

$$Y_1 = V_1 \times Y \text{ where } VR < V \qquad \text{Equation(8)}$$

When $V_1 = 1$ and $1 \leq V_2 \leq 10$ an ideal relation, as shown in equation (2) may be realized.

A further embodiment of the present invention is illustrated in FIG. 6 and will herein be described. With regard to similarly numbered elements, the description of FIG. 5 may be applied to FIG. 6. The circuit of the embodiment as illustrated in FIG. 6 is equivalent to the embodiment as illustrated in FIG. 5 except that FIG. 6 utilizes a divider 51 instead of a multiplier 41. As such, the divider 51 divides the signal Y received from the first amplifier 12a at divider input terminal 51a by the signal from the change-over switch output terminal 42c received at divider input terminal 51b and outputs the quotient at the output terminal 51c.

When the standard voltage VR is greater than the input signal Y, the comparator 33 controls the change-over switch 42 to couple the switch output 42c to the variable voltage source 44 at input terminal 42b. Therefore, the output $Y_1$ of the amplifier of FIG. 6 follows the equation (9) as follows.

$$Y_1 = Y/V_2 \text{ where } VR > Y \qquad \text{Equation(9)}$$

Further, when the standard voltage VR is less than the input signal Y, the comparator 33 controls the change-over switch 42 to couple the switch output 42c to the second standard voltage source 43 at input terminal 42a. Therefore, the output $Y_1$ of the second amplifier of FIG. 6 follows the equation (10) as follows.

$$Y_1 = Y/V_1 \text{ where } VR < Y \qquad \text{Equation(10)}$$

When $V_1 = 1$ and $0.01 \leq V_2 \leq 1$ an ideal relation, as shown in equation (2) may be realized.

Therefore, an ideal relation shown in the formula (2) can be realized, where the switch can be NMOS-FET, and it is certain through the experiments that it is effective when the operating gain ($R_4/R_3 + 1$) becomes set as 50 times as much.

As explained above, due to this invention, adequate calculating gain of output signal from the secondary charged particle detector can be obtained and therefore simultaneous observation of both the brighter area and the darker area on the sample can be realized, which was impossible before.

This application relates to subject matter disclosed in Japanese Application number 5-170612, filed on Jul. 9, 1993, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A focused Ion-beam apparatus, comprising:
    an ion source which generates ions;
    an electronic lens system which forms a focused ion-beam from said ions;
    a deflecting electrode which scans said focused ion-beam;
    a secondary charged particle detector which detects secondary charged particle emitted from a sample surface and generates a detecting signal;
    an amplifier which amplifies said detecting signal; and
    an image display which displays patterns formed on the sample surface based on a flat distribution of intensity of secondary charged particle;
    wherein said amplifier comprises a reference voltage source; a comparator which compares output of said reference voltage source with said detecting signal; and an amplifier circuit having an adjustable operating gain according to the output signal from said comparator, and wherein said amplifier circuit provides different signal treatment in amplifying ratio based upon the value of the detecting signal.

2. A focused ion-beam apparatus as claimed in the claim 1, wherein said amplifier circuit comprises:
   a differential amplifier which has an inverting input, a non-inverting input and an output;
   a switch, which is coupled to and controlled by the output of the comparator, having a first end and a second end, the first end coupled to ground, and further having a low shunt resistance;
   a first resistance, having a first end which receives an input signal and a second end coupled to the non-inverting input of said differential amplifier;
   a second resistance, having a first end coupled to the non-inverting input of said differential amplifier and a second end coupled to the second end of said switch;
   a third resistance, having a first end coupled to the inverting input of said differential amplifier and a second end coupled to ground; and
   a fourth resistance, having a first end coupled to the inverting input of said differential amplifier and a second end coupled to the output of said differential amplifier.

3. A focused ion-beam apparatus as claimed in the claim 2, wherein said first resistance and said fourth resistance have equal values and said second resistance and said third resistance have equal values.

4. A focused ion-beam apparatus comprising:
   an ion source for generating ions;
   an ion lens system for focusing said ions into a focused ion beam;
   a deflecting electrode for scanning the focused ion beam on a sample;
   a detector for detecting secondary charged particles discharged from the sample surface resulting from the scanned ion beam and which provides a detector signal related to the secondary charged particles;
   an amplifier, having an input for receiving the detector signal, and which amplifies the detector signal; and
   an image display for displaying patterns formed on the sample surface based on a flat intensity distribution of the secondary charged particles;
   wherein said amplifier comprises a first standard voltage source which generates a first standard voltage; a comparator which receives a signal based upon the detector signal at a first terminal and the first standard voltage at a second terminal and compares the signal based upon the detector signal and the first standard voltage and produces an output signal; a second standard voltage source which generates a second standard voltage; a variable voltage source which generates a voltage; a change-over switch having first state wherein an input terminal connected to the second standard voltage source is selected and a second state wherein an input terminal connected to the variable voltage source is selected and an output terminal which produces a signal dependent upon the switch state, wherein said switch state is dependent upon the output of said comparator; and a multiplier having a first terminal which receives an input signal based upon the detector signal and a second terminal which is coupled to and receives an input signal from the change-over switch output terminal and an output terminal which produces a output signal equivalent to the product of the first terminal signal and the second terminal signal.

5. A focused ion-beam apparatus comprising:
   an ion source for generating ions;
   an ion lens system for focusing said ions into a focused ion beam;
   a deflecting electrode for scanning the focused ion beam on a sample;
   a detector for detecting secondary charged particles discharged from the sample surface resulting from the scanned ion beam and which provides a detector signal related to the secondary charged particles;
   an amplifier, having an input for receiving the detector signal, and which amplifies the detector signal; and
   an image display for displaying patterns formed on the sample surface based on a flat intensity distribution of the secondary charged particles;
   wherein said amplifier comprises a first standard voltage source which generates a first standard voltage; a comparator which receives a signal based upon the detector signal at a first terminal and the first standard voltage at a second terminal and compares the signal based upon the detector signal and the first standard voltage and produces an output signal; a second standard voltage source which generates a second standard voltage; a variable voltage source which generates a voltage; a change-over switch having first state wherein an input terminal connected to the second standard voltage source is selected and a second state wherein an input terminal connected to the variable voltage source is selected and an output terminal which produces a signal dependent upon the switch state, wherein said switch state is dependent upon the output of said comparator; and a divider having a first terminal which receives an input signal based upon the detector signal and a second terminal which is coupled to and receives an input signal from the change-over switch output terminal and an output terminal which produces a output signal equivalent to the quotient of the first terminal signal and the second terminal signal.

* * * * *